(12) United States Patent
Kreuzer

(10) Patent No.: US 11,095,267 B2
(45) Date of Patent: Aug. 17, 2021

(54) COUPLED RESONATOR FILTER WITH EMBEDDED BORDER RING

(71) Applicant: Qorvo US, Inc., Greensboro, NC (US)

(72) Inventor: Susanne Kreuzer, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/287,277

(22) Filed: Feb. 27, 2019

(65) Prior Publication Data

US 2019/0305755 A1 Oct. 3, 2019

Related U.S. Application Data

(60) Provisional application No. 62/649,339, filed on Mar. 28, 2018.

(51) Int. Cl.
| | |
|---|---|
| H03H 9/58 | (2006.01) |
| H03H 9/02 | (2006.01) |
| H03H 9/00 | (2006.01) |
| H03H 9/13 | (2006.01) |

(52) U.S. Cl.
CPC .......... *H03H 9/584* (2013.01); *H03H 9/0095* (2013.01); *H03H 9/02637* (2013.01); *H03H 9/13* (2013.01)

(58) Field of Classification Search
CPC .. H03H 9/584; H03H 9/02637; H03H 9/0095; H03H 9/13; H03H 9/587; H03H 9/585; H03H 9/02118; H03H 9/02125
USPC ......................... 333/187, 188, 189
See application file for complete search history.

(56) References Cited

U.S. PATENT DOCUMENTS

| | | | |
|---|---|---|---|
| 8,456,257 B1 | 6/2013 | Fattinger | |
| 8,575,820 B2* | 11/2013 | Shirakawa | H03H 3/02 310/320 |
| 2009/0206706 A1* | 8/2009 | Iwaki | H03H 9/174 310/365 |
| 2012/0049976 A1 | 3/2012 | Son et al. | |
| 2012/0218058 A1* | 8/2012 | Burak | H03H 9/0211 333/191 |

(Continued)

OTHER PUBLICATIONS

Notice of Allowance for U.S. Appl. No. 15/279,897, dated Sep. 19, 2019, 8 pages.

(Continued)

*Primary Examiner* — Robert J Pascal
*Assistant Examiner* — Jorge L Salazar, Jr.
(74) *Attorney, Agent, or Firm* — Withrow & Terranova, PLLC

(57) ABSTRACT

A coupled resonator filter includes a first resonator, a second resonator, one or more intervening layers, a first border ring, and a second border ring. The first resonator includes a first piezoelectric layer and a first electrode in contact with the first piezoelectric layer. The second resonator includes a second piezoelectric layer and a second electrode in contact with the second piezoelectric layer. The one or more intervening layers are between the first resonator and the second resonator and acoustically couple the first resonator and the second resonator. The first border ring is on the first electrode. The second border ring is on the second electrode. By providing both the first border ring and the second border ring, spurious modes in the coupled resonator filter may be suppressed, thereby improving the performance thereof.

20 Claims, 7 Drawing Sheets

(56) References Cited

U.S. PATENT DOCUMENTS

| | | |
|---|---|---|
| 2014/0176261 A1 | 6/2014 | Burak et al. |
| 2015/0280687 A1 | 10/2015 | Burak et al. |
| 2015/0318837 A1 | 11/2015 | Zou et al. |
| 2015/0349743 A1 | 12/2015 | Burak et al. |
| 2017/0054430 A1 | 2/2017 | Fattinger et al. |
| 2017/0263844 A1 | 9/2017 | Tajic et al. |

OTHER PUBLICATIONS

Fattinger, "Optimization of acoustic dispersion for high performance thin film BAW resonators," IEEE Ultrasonics Symposium, 2005, pp. 1175-1178.

Fattinger, "Spurious mode suppression in coupled resonator filters," Microwave Symposium Digest, Jul. 2005, pp. 409-412.

Katila, J., et al., "Spurious Resonance Free Bulk Acoustic Wave Resonators," International Ultrasonics Symposium, 2003, vol. 1, IEEE, pp. 84-87.

Larson, John, et al., "Characterization of Reversed c-axis AlN thin films," International Ultrasonics Symposium, Oct. 2010, IEEE, pp. 1054-1059.

Park, "Advanced lateral structures of BAW resonators for spurious mode suppression," 42nd European Microwave Conference, Nov. 2012, pp. 104-107.

Thalhammer, Robert et al., "Finite Element Analysis of BAW Devices: Principles and Perspectives," 2015 IEEE International Ultrasonics Symposium Proceedings, Oct. 2015, IEEE, 10 pages.

Thalhammer, Robert et al., "Spurious mode suppression in BAW resonators," 2006 IEEE Ultrasonics Symposium, Oct. 2006, IEEE, pp. 456-459.

Non-Final Office Action for U.S. Appl. No. 15/279,897, dated Oct. 16, 2018, 13 pages.

Final Office Action for U.S. Appl. No. 15/279,897, dated Mar. 5, 2019, 12 pages.

Advisory Action and Applicant-Initiated Interview Summary for U.S. Appl. No. 15/279,897, dated Apr. 29, 2019, 4 pages.

Notice of Allowance for U.S. Appl. No. 15/279,897, dated Jun. 10, 2019, 7 pages.

Final Office Action for U.S. Appl. No. 14/877,324, dated Jun. 16, 2017.

Non-Final Office Action for U.S. Appl. No. 14/877,324, dated Dec. 1, 2016, 8 pages.

\* cited by examiner

COUPLED RESONATOR FILTER WITH EMBEDDED BORDER RING

RELATED APPLICATIONS

This application claims the benefit of provisional patent application Ser. No. 62/649,339, filed Mar. 28, 2018, the disclosure of which is hereby incorporated herein by reference in its entirety.

FIELD OF THE DISCLOSURE

The present disclosure relates to coupled resonator filters, and in particular to coupled resonator filters included an embedded border ring.

BACKGROUND

Acoustic filters are used extensively in modern wireless communications devices. As wireless communications standards continue to evolve and incorporate more communications bands, which are narrower in bandwidth and higher in frequency, designing acoustic filters to meet the stringent requirements of these standards is becoming increasingly difficult. In recent years, coupled resonator filters have emerged, which offer to provide filtering capabilities beyond those previously achievable by conventional surface acoustic wave and bulk acoustic wave filters. Coupled resonator filters often provide higher selectivity than their conventional surface acoustic wave and bulk acoustic wave filter counterparts, and may operate at higher frequencies as well. Accordingly, coupled resonator filters show promise in their capability for filtering signals within narrow signal bands at high frequencies, as is increasingly required by evolving standards. However, conventional coupled resonator filters suffer from many problems that have typically been found in conventional surface acoustic wave and bulk acoustic wave filters. For example, coupled resonator filters may include spurious modes that degrade their performance. While several design changes have been made to conventional surface acoustic wave and bulk acoustic wave filters in an effort to suppress spurious modes, the different operating characteristics of coupled resonator filters often means that these design changes do not have the same effect. As a result, coupled resonator filters continue to suffer from spurious modes which degrade their performance. In light of the above, there is a need for coupled resonator filters with decreased spurious modes and thus improved performance.

SUMMARY

In one embodiment, a coupled resonator filter includes a first resonator, a second resonator, one or more intervening layers, a first border ring, and a second border ring. The first resonator includes a first piezoelectric layer and a first electrode in contact with the first piezoelectric layer. The second resonator includes a second piezoelectric layer and a second electrode in contact with the second piezoelectric layer. The one or more intervening layers are between the first resonator and the second resonator and acoustically couple the first resonator and the second resonator. The first border ring is on the first electrode. The second border ring is on the second electrode. By providing both the first border ring and the second border ring, spurious modes in the coupled resonator filter may be suppressed, thereby improving the performance thereof.

In one embodiment, a coupled resonator filter includes a first resonator, a second resonator, one or more intervening layers, a first border ring, and a second border ring. The first resonator includes a first piezoelectric layer and a first electrode in contact with the first piezoelectric layer. The second resonator includes a second piezoelectric layer and a second electrode in contact with the second piezoelectric layer. The one or more intervening layers are between the first resonator and the second resonator and acoustically couple the first resonator and the second resonator. The first border ring is on the first electrode. The second border ring is on a first one of the one or more intervening layers. By providing both the first border ring and the second border ring, spurious modes in the coupled resonator filter may be suppressed, thereby improving the performance thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
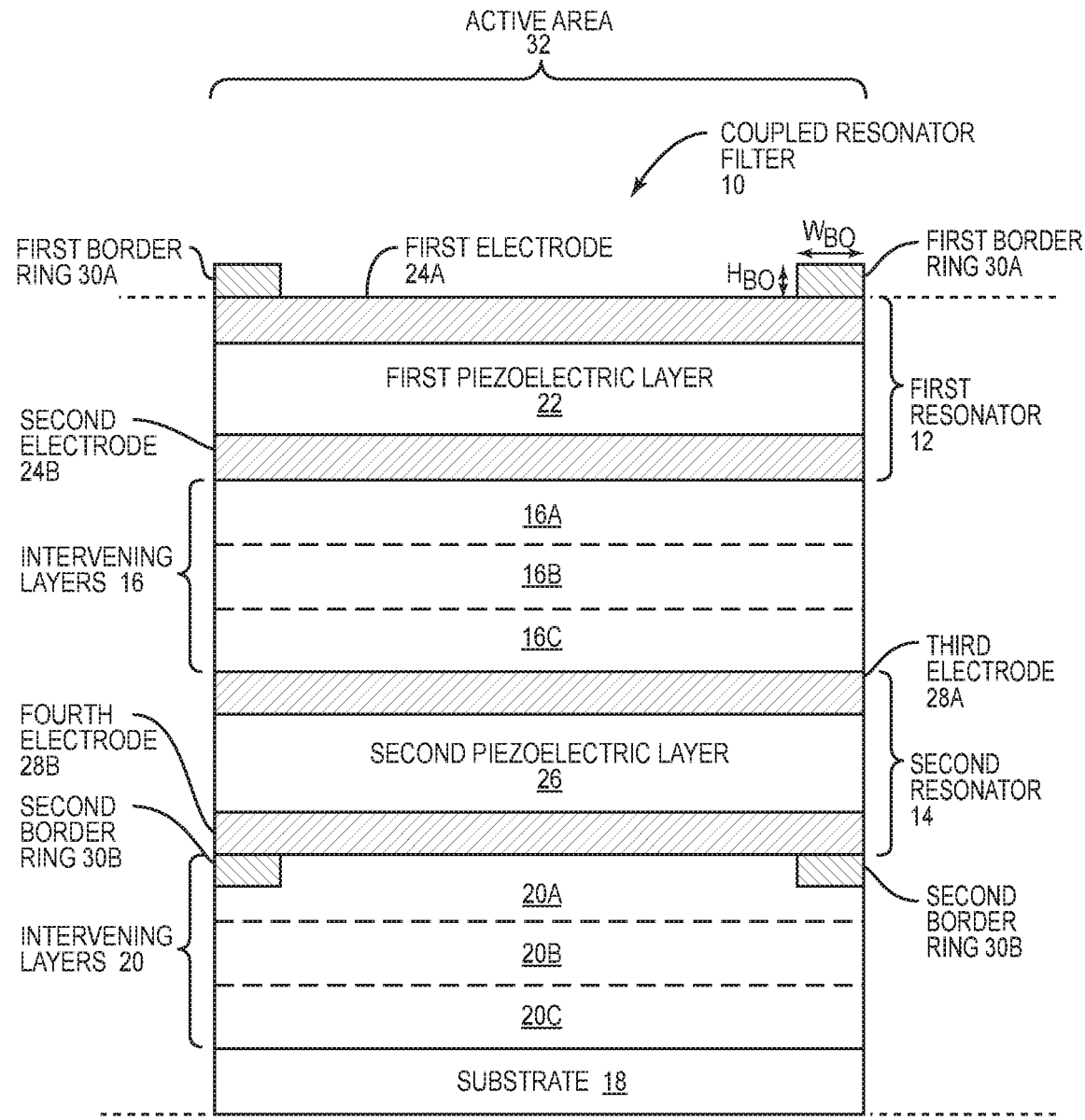
FIG. 1 shows a cross-sectional view of a coupled resonator filter according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a cross-section of a coupled resonator filter 10 according to one embodiment of the present disclosure. The coupled resonator filter 10 includes a first resonator 12, a second resonator 14, one or more intervening layers 16 between the first resonator 12 and the second resonator 14, a substrate 18, and one or more additional intervening layers 20 between the second resonator 14 and the substrate 18. The first resonator 12 is over the second resonator 14. The second resonator 14 is over the substrate 18. The first resonator 12 is a bulk acoustic wave (BAW) resonator including a first piezoelectric layer 22 sandwiched between a first electrode 24A and a second electrode 24B. The second resonator 14 is also a BAW resonator including a second piezoelectric layer 26 sandwiched between a third electrode 28A and a fourth electrode 28B. The intervening layers 16 are between the second electrode 24B and the third electrode 28A. The additional intervening layers 20 are between the fourth electrode 28B and the substrate 18.

The intervening layers 16 and the additional intervening layers 20 acoustically (i.e., mechanically) couple the first resonator 12 and the second resonator 14 to a desired degree. The amount of acoustic coupling between the first resonator 12 and the second resonator 14 may be adjusted to provide a desired filter response. As discussed above, the coupled resonator filter 10 may suffer from spurious modes that degrade the performance thereof. Accordingly, a first border ring 30A and a second border ring 30B are provided. In the present embodiment, the first border ring 30A is provided on the first electrode 24A and the second border ring 30B is provided on the fourth electrode 28B. Specifically, the first border ring 30A is provided on a surface of the first electrode 24 that forms the top of the coupled resonator filter 10. The second border ring 30B is provided on a surface of the fourth electrode 28B opposite the top of the coupled resonator filter 10 such that the second resonator 14 is between the second border ring 30B and the top of the coupled resonator filter 10. As discussed herein, a border ring is an area of increased or decreased mass on the layer on which it is provided. In the present embodiment, the first border ring 30A and the second border ring 30B are shown as additional metal layers on the first electrode 24A and the fourth electrode 28B, respectively, and thus increase the mass of the first electrode 24A and the second electrode 28B, respectively, over the area on which they are provided. The first border ring 30A and the second border ring 30B may be provided as a frame-like structure along a periphery of an active area 32 of the coupled resonator filter 10, wherein the active area 32 is the area in which the electrodes 24 of the first resonator 12 overlap with the electrodes 28 of the second resonator 14. A middle portion of the first border ring 30A and the second border ring 30B may be empty. That is, a middle portion of the first border ring 30A and the second border ring 30B may not change the mass of the layer on which they are respectively provided. A width $W_{BO}$ and a height $H_{BO}$ of the first border ring 30A and the second border ring 30B may be adjusted independently as necessary to provide a desired response. Further, a material of the first border ring 30A and the second border ring 30B may be chosen to provide a desired response. In one embodiment, the first border ring 30A and the second border ring 30B comprise tungsten (W).

While border rings have been used to suppress spurious modes in conventional bulk acoustic wave resonators for some time, they have conventionally been applied only to a top electrode of the device. Providing a single border ring in this conventional way may reduce the performance of a coupled resonator filter, as it may not suppress spurious modes and further can lead to an increase in insertion loss. Further, using a single border ring on the top electrode of a coupled resonator filter does not allow for the adjustment of spurious mode suppression, as a thickness of such a conventional border ring hardly impacts the dispersion in the border ring region. By adding the second border ring 30B, which is embedded in the coupled resonator filter 10, spurious modes may be suppressed. Further, the insertion loss of the coupled resonator filter 10 is not significantly increased. Finally, adding the second border ring 30B moves a border ring mode of the device (conventionally seen as a dip in insertion loss in devices including only a single border ring) below a passband of the coupled resonator filter 10.

In one embodiment, the intervening layers 16 and the additional intervening layers 20 comprise silicon oxide (SiO$_2$) and/or tungsten (W). In various embodiments, the intervening layers 16 and the additional intervening layers 20 may be alternating layers having different materials. The first piezoelectric layer 22 and the second piezoelectric layer 26 comprise, for example, aluminum nitride (AlN). The first electrode 24A, the second electrode 24B, the third electrode 28A, and the fourth electrode 28B comprise metal stacks including tungsten (W) and aluminum copper (AlCu). The substrate comprises silicon (Si). Those skilled in the art will readily appreciate that different materials may be used for the portions of the coupled resonator filter 10 listed above, all of which are contemplated herein.

Figure 2:
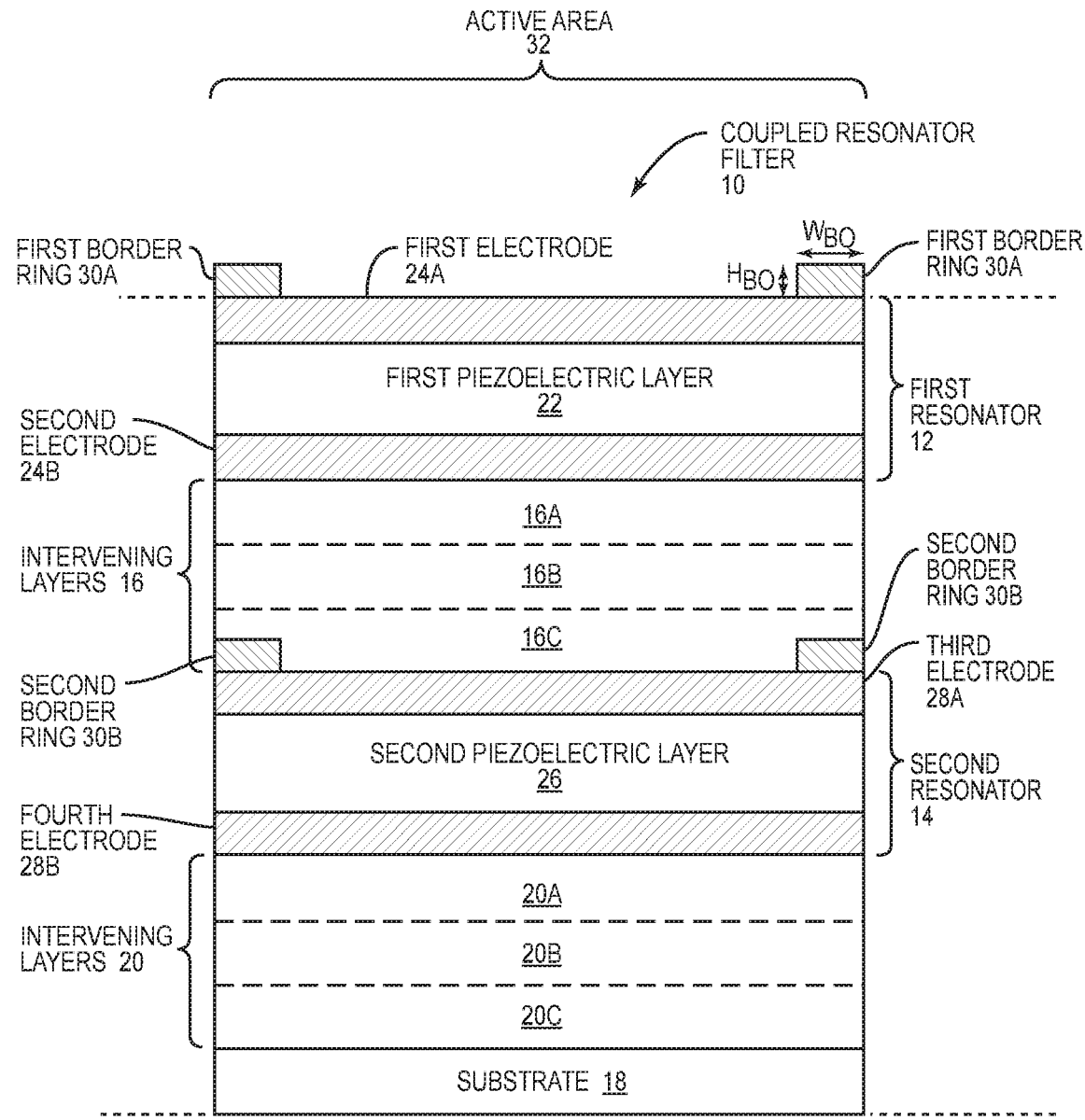
FIG. 2 shows a cross-sectional view of a coupled resonator filter according to one embodiment of the present disclosure.

FIG. 2 shows the coupled resonator filter 10 according to an additional embodiment of the present disclosure. The coupled resonator filter 10 shown in FIG. 2 is substantially similar to that shown in FIG. 1, except that the second border ring 30B is on the third electrode 28A instead of the fourth electrode 28B. Specifically, the second border ring 30B is provided on a surface of the third electrode 28A facing the top of the coupled resonator filter 10 such that the second border ring 30B is between the second resonator 14 and the top of the coupled resonator filter 10. In some embodiments, the coupled resonator filter 10 may include more than two border rings 30. For example, the embodiments described with respect to FIG. 1 and FIG. 2 may be combined such that the second border ring 30B is located on the third electrode 28A as shown in FIG. 2 and the second border ring 30B is located on the fourth electrode 28B as shown in FIG. 1.

Figure 3:
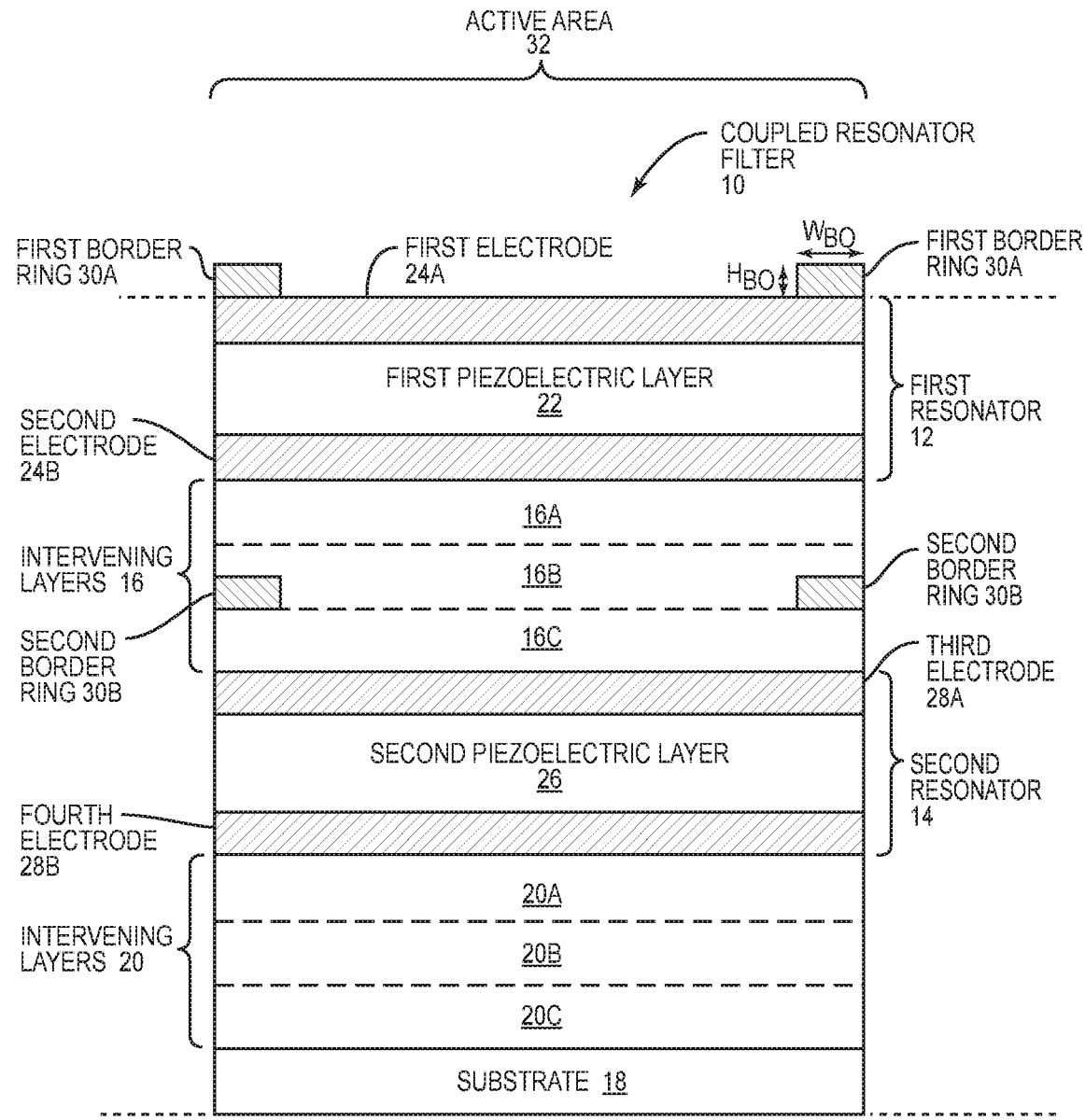
FIG. 3 shows a cross-sectional view of a coupled resonator filter according to one embodiment of the present disclosure.

FIG. 3 shows the coupled resonator filter 10 according to an additional embodiment of the present disclosure. The coupled resonator filter 10 shown in FIG. 3 is substantially similar to that shown in FIG. 1, except that the second border ring 30B is on one of the intermediate layers 16, and in particular on a third intermediate layer 16C instead of the fourth electrode 28B. Notably, the second border ring 30B may be located on any one of the intermediate layers 16 such as a first intermediate layer 16A and a second intermediate layer 16B as well, and further may be located on any surface thereof. In some embodiments, the coupled resonator filter 10 may include more than two border rings 30. For example, the embodiments with respect to FIG. 1, FIG. 2, and FIG. 3 may be combined in any similar manner to that discussed above.

Figure 4:
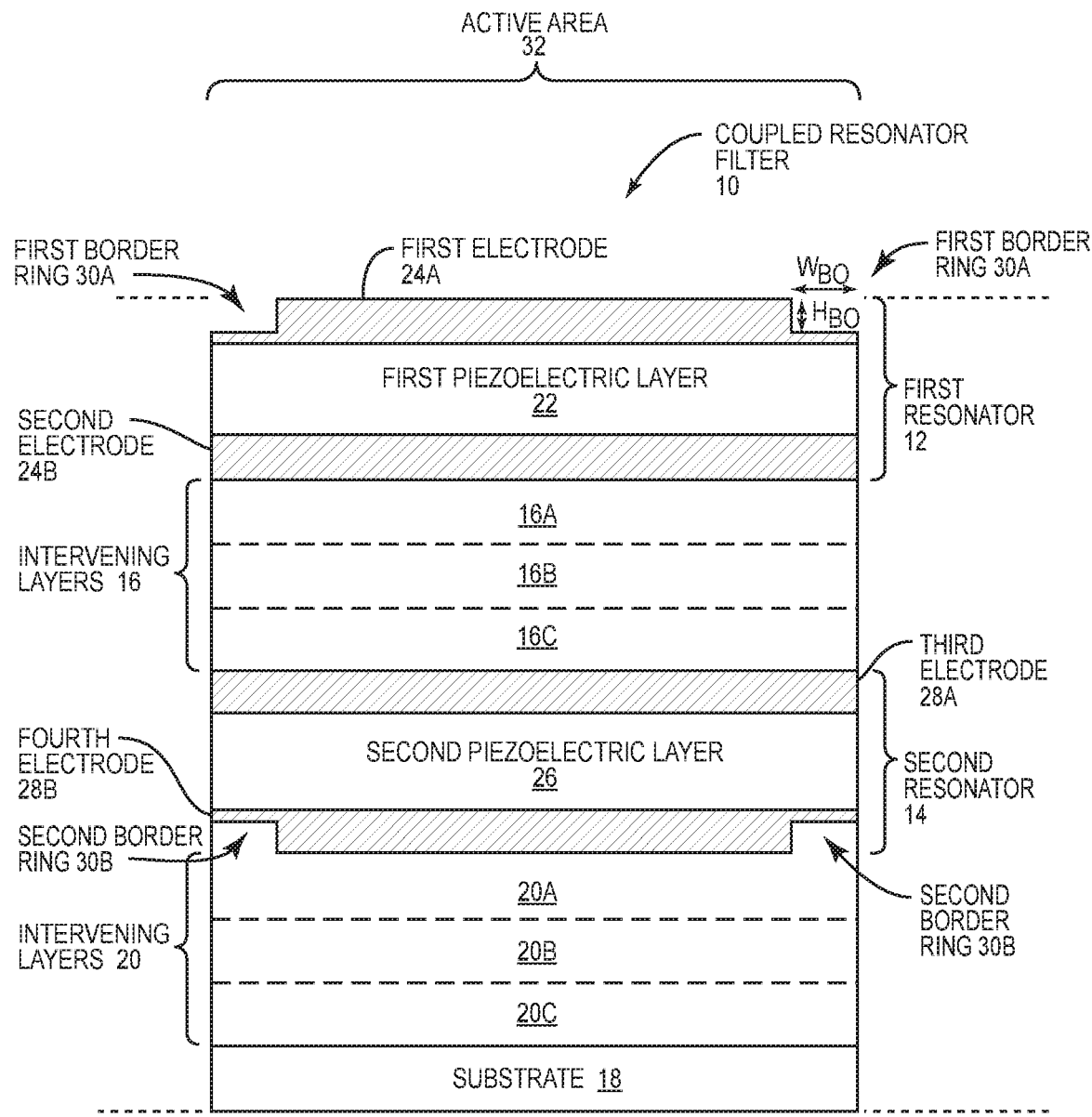
FIG. 4 shows a cross-sectional view of a coupled resonator filter according to one embodiment of the present disclosure.
Figure 5:
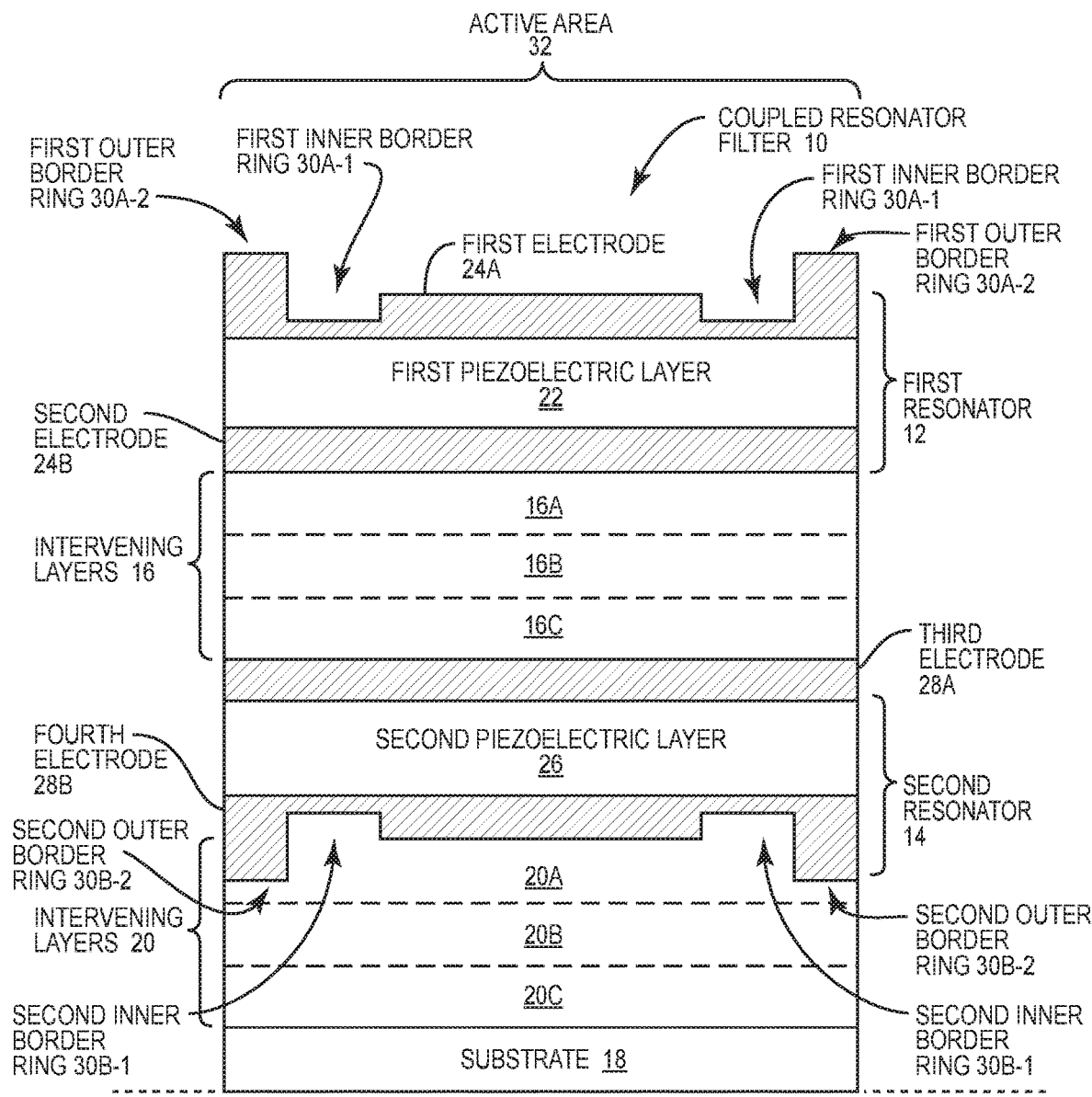
FIG. 5 shows a cross-sectional view of a coupled resonator filter according to one embodiment of the present disclosure.

As discussed above, the border rings 30 may provide an increase in mass or a decrease in mass on a layer on which they are provided. Further, the border rings 30 may provide an increase in mass in one area of the layer on which they are provided and a decrease in mass in another area of the layer on which they are provided. FIG. 4 illustrates the first border ring 30A and the second border ring 30B as areas of decreased mass on the first electrode 24A and the second electrode 24B, respectively. FIG. 5 illustrates the first border ring 30A and the second border ring 30B in a "step" configuration such that some portions of the border ring decrease mass while other portions of the border ring increase mass, or different portions of the border ring change the mass by different amounts. In particular, FIG. 5 shows the first border ring 30A as a first inner border ring 30A-1 and a first outer border ring 30A-2 and the second border ring 30B as a second inner border ring 30B-1 and a second outer border ring 30B-2. The first inner border ring 30A-1 and the second inner border ring 30B-1 are areas of decreased mass on the first electrode 24A and the fourth electrode 28B, respectively. The first outer border ring 30A-2 and the second outer border ring 30B-2 are areas of increased mass on the first electrode 24A and the fourth electrode 28B, respectively. Those skilled in the art will readily appreciate that while only two "steps" are shown (an area of decreased mass and an area of increased mass), the first border ring 30A and the second border ring 30B may comprise any number of "steps" to achieve a desired effect.

Figure 6:
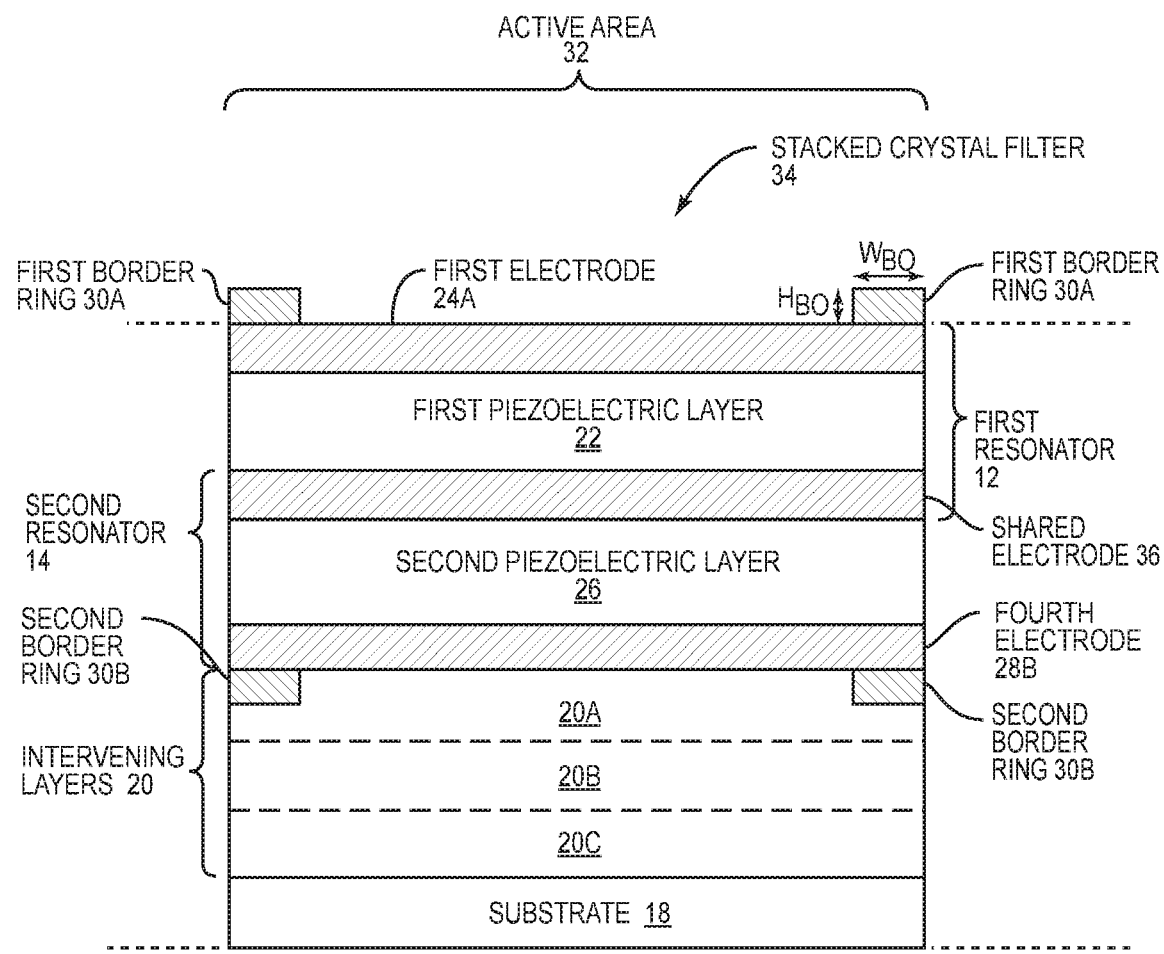
FIG. 6 shows a cross-sectional view of a stacked crystal filter according to one embodiment of the present disclosure.

The principles of the present disclosure apply equally to a stacked crystal filter 34, an example of which is illustrated in FIG. 6. The stacked crystal filter 34 is substantially similar to the coupled resonator filter 10, except that the intermediate layers 16 are removed and the second electrode 24B is combined with the third electrode 28A to provide a shared electrode 36. While only a single configuration of the first border ring 30A and the second border ring 30B is shown for the stacked crystal filter 34 in FIG. 6, those skilled in the art will appreciate that any of the variations for the first border ring 30A and the second border ring 30B discussed above with respect to the coupled resonator filter 10 apply equally to the stacked crystal filter 34.

Figure 7:
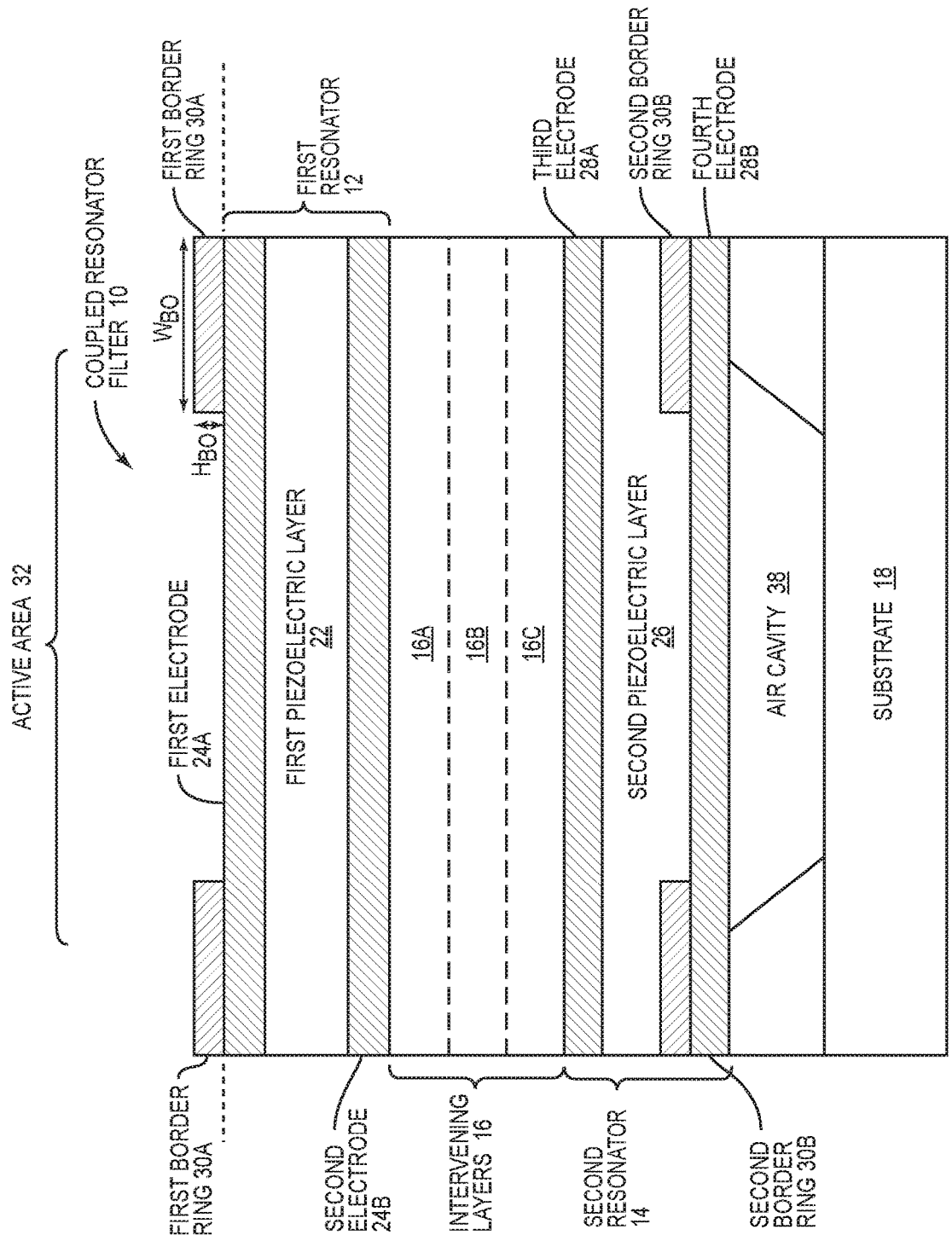
FIG. 7 shows a cross-sectional view of a coupled resonator filter according to one embodiment of the present disclosure.

The principles of the present disclosure also apply equally to coupled resonator filters including one or more thin film bulk acoustic wave resonators (FBARs). Such a coupled resonator filter 10 is illustrated in FIG. 7. The coupled resonator filter 10 shown in FIG. 7 is substantially similar to those discussed above with respect to FIGS. 1-5, except that the intermediate layers 20 are removed and the second resonator 14 is suspended over an air cavity 38 in the substrate 18. While the air cavity 38 is shown having a particular size and shape for purposes of illustration, those skilled in the art will readily appreciate that the air cavity 38 may be provided in any number of different configurations, all of which are contemplated herein. Further, while only a single configuration of the first border ring 30A and the second border ring 30B are shown in FIG. 7, those skilled in the art will appreciate that any of the variations for the first border ring 30A and the second border ring 30B discussed above apply equally to the embodiment shown in FIG. 7.

Those skilled in the art will recognize improvements and modifications to the preferred embodiments of the present disclosure. All such improvements and modifications are considered within the scope of the concepts disclosed herein and the claims that follow.

What is claimed is:

1. A coupled resonator filter (CRF) comprising:
   a first resonator comprising a first piezoelectric layer and a first electrode in contact with the first piezoelectric layer;
   a second resonator comprising a second piezoelectric layer and a second electrode in contact with the second piezoelectric layer;
   one or more intervening layers between the first resonator and the second resonator, the one or more intervening layers acoustically coupling the first resonator and the second resonator;
   a first metal border ring on a first portion of the first electrode such that the first portion has an increased thickness relative to another portion of the first electrode; and
   a second metal border ring on a second portion of the second electrode such that the second portion has an increased thickness relative to another portion of the second electrode.

2. The CRF of claim 1 wherein the first resonator and the second resonator are bulk acoustic wave (BAW) resonators.

3. The CRF of claim 2 wherein the first electrode forms a top surface of the CRF.

4. The CRF of claim 3 wherein the second piezoelectric layer is between the second electrode and the first resonator.

5. The CRF of claim 4 further comprising one or more additional intervening layers between the second resonator and a bottom surface of the CRF.

6. The CRF of claim 3 wherein the second electrode is between the second piezoelectric layer and the first resonator.

7. The CRF of claim 1 further comprising a first additional electrode on the first piezoelectric layer such that the first piezoelectric layer is between the first electrode and the first additional electrode.

8. The CRF of claim 7 further comprising a second additional electrode on the second piezoelectric layer such that the second piezoelectric layer is between the second electrode and the second additional electrode.

9. The CRF of claim 1 wherein the second piezoelectric layer is between the second electrode and the first resonator.

10. The CRF of claim 1 wherein the second electrode is between the second piezoelectric layer and the first resonator.

11. The CRF of claim 1 wherein the first metal border ring is provided along an outside edge of an active area of the CRF.

12. The CRF of claim 11 wherein the second metal border ring is provided along an outside edge of the active area of the CRF.

13. A coupled resonator filter (CRF) comprising:
a first resonator comprising a first piezoelectric layer and a first electrode in contact with the first piezoelectric layer;
a second resonator comprising a second piezoelectric layer and a second electrode in contact with the second piezoelectric layer;
one or more intervening layers between the first resonator and the second resonator, the one or more intervening layers acoustically coupling the first resonator and the second resonator;
a first metal border ring increasing a thickness of the first electrode; and
a second metal border ring on a first one of the one or more intervening layers.

14. The CRF of claim 13 wherein the first resonator and the second resonator are bulk acoustic wave (BAW) resonators.

15. The CRF of claim 14 wherein the first electrode forms a top surface of the CRF.

16. The CRF of claim 15 wherein at least one of the one or more intervening layers is between the first one of the one or more intervening layers and the first resonator.

17. The CRF of claim 13 further comprising one or more additional intervening layers between the second resonator and a bottom surface of the CRF.

18. The CRF of claim 13 wherein the first one of the one or more intervening layers is a metal layer.

19. The CRF of claim 13 wherein the first metal border ring is provided along an outside edge of an active area of the CRF.

20. The CRF of claim 19 wherein the second metal border ring is provided along an outside edge of the active area of the CRF.

* * * * *